United States Patent [19]

Leonard et al.

[11] Patent Number: 5,068,592
[45] Date of Patent: Nov. 26, 1991

[54] DETECTOR OF THE REGULATED VOLTAGE TWO WIRE TYPE

[75] Inventors: Didier Leonard, Hiersac; Stephane Even, Angouleme, both of France

[73] Assignee: Telemecanique, France

[21] Appl. No.: 633,920

[22] Filed: Dec. 26, 1990

[30] Foreign Application Priority Data

Dec. 28, 1989 [FR] France ............................. 89 17321

[51] Int. Cl.$^5$ .......................... G05F 1/613; G05F 3/16
[52] U.S. Cl. ................................. 323/224; 323/269; 323/270; 361/179
[58] Field of Search ............... 323/222, 224, 299, 282, 323/283, 284, 285, 268, 269, 270; 363/71

[56] References Cited

U.S. PATENT DOCUMENTS

| | | | |
|---|---|---|---|
| 3,599,083 | 8/1971 | Bugge-Asperheim | 323/289 |
| 4,027,227 | 5/1977 | Engel | 323/224 |
| 4,075,546 | 2/1978 | Barber | 323/224 |
| 4,168,443 | 9/1979 | Periot | 361/179 |
| 4,415,945 | 11/1983 | Periot | 361/100 |
| 4,456,834 | 6/1984 | Harris | 307/91 |
| 4,555,660 | 11/1985 | von Winnicki | 323/224 |
| 4,728,866 | 3/1988 | Capewell | 315/224 |
| 4,729,088 | 3/1988 | Wong | 363/124 |
| 4,791,349 | 12/1988 | Minks | 323/266 |
| 4,812,736 | 3/1989 | Albach et al. | 323/224 |
| 4,841,564 | 6/1989 | Schoofs | 379/413 |
| 4,906,858 | 3/1990 | Gesin | 340/567 |

Primary Examiner—Steven L. Stephan
Assistant Examiner—Ben Davidson
Attorney, Agent, or Firm—William A. Drucker

[57] ABSTRACT

A detector of the two wire type with regulated voltage is disclosed, comprising a sensor and a switching device.

The switching device comprises a series voltage regulation circuit, a parallel voltage regulation circuit and switching circuit. The latter receives the output signal from the sensor for alternately activating the series circuit in a first state of the signal and the parallel circuit in a second state of the signal.

5 Claims, 1 Drawing Sheet

DETECTOR OF THE REGULATED VOLTAGE TWO WIRE TYPE

BACKGROUND OF THE INVENTION

The present invention relates to a detector of the two wire type comprising a sensor adapted for delivering an output signal in two states, and a switching device adapted for switching a load as a function of the state of the output signal, the load being placed in series with a voltage source which feeds the detector.

Detectors thus adapted are also termed "two wire" detectors for they are connected to the load and to the source by only two wires and they are supplied in series with the load. They are for example proximity detectors or similar in which the magnitude to be detected modifies the characteristics of an oscillation.

To improve the performances of such detectors, attempts are made in particular to minimize both the residual current which it consumes when it stops operation of the load (off state) and the waste voltage which it generates when it causes the load to operate (on state). It is also desirable to regulate the voltage delivered to the sensor from the source, in particular in the transitory phases during which the detector passes from the on state to the off state and vice versa.

SUMMARY OF THE INVENTION

The object of the invention is in particular to provide a detector of this type with optimum regulation of the voltage delivered to the sensor particularly in each of the off and on phases.

Another object is to reduce the number and dimensions of the components used for constructing a detector of the type described.

According to the invention, the switching device comprises:
a series voltage regulation circuit
a parallel voltage regulation circuit
a switching device receiving the output signal from the sensor for alternately activating the series regulation circuit in a first state of the signal and the parallel regulation circuit in a second state of the signal.

Preferably, the series regulation circuit and the parallel regulation circuit have in common a voltage reference and feed back regulation member, this member being advantageously integratable. The switching device may comprise a first and second switch controllable in opposition by the output signal of the sensor for short-circuiting respectively a ballast transistor belonging to the series regulation circuit and an output transistor belonging to the parallel regulation circuit.

The desired voltage regulation is thus obtained stably and precisely with a reduced number and volume of components not only in the off state but also in the on state of the detector; a capacitor may in addition be provided at the terminals of the sensor for providing voltage stability during the transitory phases.

BRIEF DESCRIPTION OF THE DRAWINGS

A non limitative embodiment of the invention will now be described with reference to the accompanying drawings, in which.

DESCRIPTION OF THE PREFERRED EMBODIMENT

Figure 1:
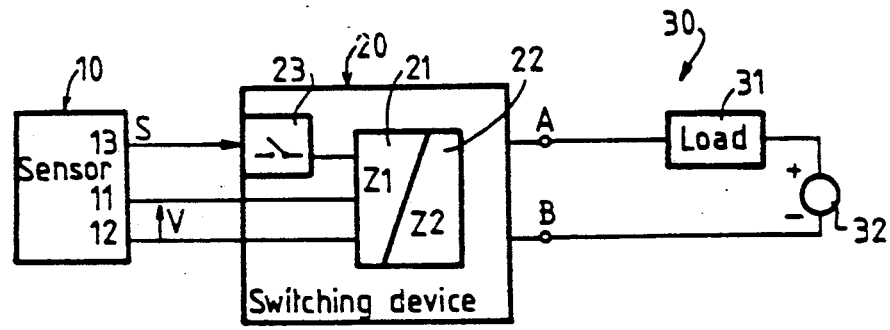
FIG. 1 shows schematically a detector according to the invention.

The detector illustrated in FIG. 1 comprises a sensor 10 for detecting the variation of a presence or a magnitude and a switching device 20 which changes state under the dependence of a signal S generated by the sensor as a function of the presence or of the variable magnitude to establish and, respectively, stop the operation of a load.

The switching device 20 is connectable via two terminals A and B to a user circuit 30 comprising a load 31 in series with a voltage source 32. Device 20 is connected with the load and the source by two conductors, the source supplying the load and the detector. The voltage source is a DC voltage source or an AC voltage source, in this latter case a rectifier being provided at the input of the detector; the purpose of the switching device 20 is to switch the load 31 and to serve as interface between the sensor 10 and circuit 30, regulating the voltage delivered by the voltage source and delivering a regulated voltage at terminals 11, 12 of the sensor whatever the state of the latter.

When the detector opens the user circuit 30, the residual current consumed by its electronic circuits must be as low as possible; similarly, when the detector closes the user circuit, the waste voltage which it generates and which supplies its electronic circuits must be as low as possible.

For this, the switching device comprises a series voltage regulation circuit 21 combined with a parallel voltage regulation circuit 22, each of circuits 21, 22 comprising an active component whose impedances Z1 and Z2 respectively, provides the desired regulation. The device 20 further comprises a switching device 23 which receives the signal S produced at an output 13 of the sensor for alternately using the series voltage regulation circuit 21 in a first state of signal S and the parallel voltage regulation circuit 22 in a second state of signal S.

It follows from this structure of the switching device 20 that the supply voltage delivered at terminals 11, 12 of sensor 10 is regulated, on the one hand by the series circuit 21 when the detector is at rest and the load inoperative and, on the other hand, by the parallel circuit 22 when the detector is active and the load is operating. A capacitor not shown may be provided at the terminals of the sensor for ensuring stability of the voltage in the transitory phases.

Figure 2:
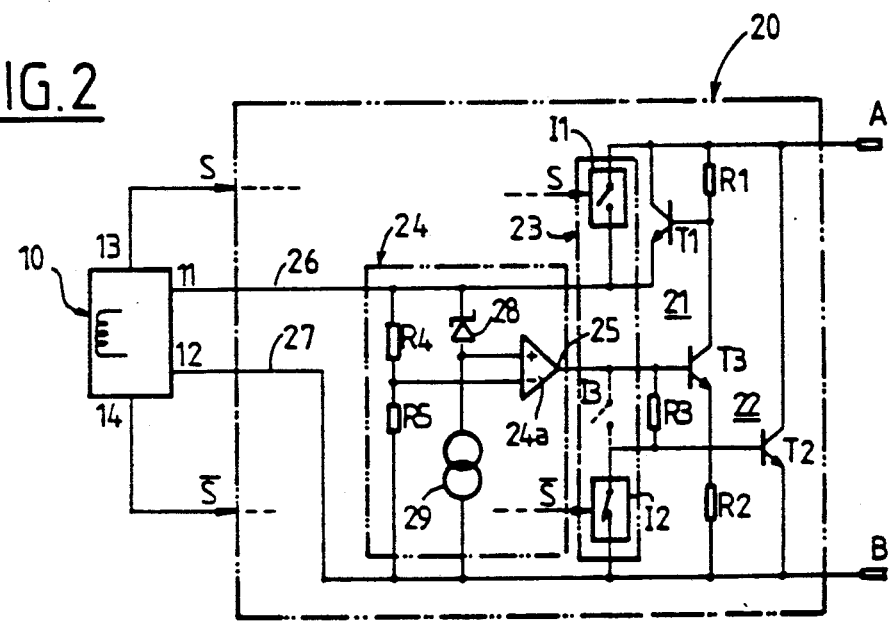
FIG. 2 shows in greater detail the diagram of a proximity detector according to the invention.

FIG. 2 shows in greater detail the circuitry of a proximity detector according to the invention. Sensor 10 of this detector generates an oscillation which is damped to a greater or lesser extent depending on the distance of an object to be detected, such damping being suitably represented by signal S. It should be noted that circuits 21, 22 have the same voltage reference and feedback regulation member 24.

The series regulation circuit 21 comprises a ballast transistor T1 of npn type whose collector is connected to terminal A and emitter to terminal 11 of sensor 10; the base of T1 is biassed by being connected to terminal A through a resistor R1 and it is connected to the collector of a transistor T3 whose base is connected to the output 25 of the feedback member 24. The base of T3 is connected to the emitter thereof via a resistor R3.

The parallel regulation circuit 22 comprises a power transistor T2 whose collector-emitter path is connected between the terminals A and B and whose base is connected, on the one hand to the emitter via a resistor R2 and on the other to the output 25 of the feedback member 24 via the resistor R3.

The switching device 23 comprises a switch I1 controlled by the signal S delivered by sensor 10, this switch being connected for short-circuiting the main path of transistor T1. Circuit 23 also comprises a switch I2 controlled by the inverted output signal $\bar{S}$ of the sensor, this switch being connected for short-circuiting the base-emitter path of transistor T2. The signal $\bar{S}$ may be supplied with signal S to the respective outputs 13, 14 of sensor 10 or be formed from S by device 20. Switches I1, I2 are bipolar or MOS transistors. Circuit 23 may also comprise a switch I3 controlled by the signal S and connected for short-circuiting R3, so as to reduce the voltage drop between output 25 and the base of T2. Thus, regulation is facilitated when the voltage to be regulated is very low. Switch I3 is illustrated with broken lines in FIGS. 2 and 4.

The feedback member 24 comprises a resistive bridge R4, R5 disposed between the two conductors 26, 27 feeding the sensor and a voltage reference element 28 connected in series with a current source 29 between conductors 26, 27. Conductor 26 is connected to the high potential terminal A via T1 and conductor 27 is connected to the low potential terminal B, for example at 0 volt. The voltage reference element 28 is for example a Zener diode or a set of diodes or preferably a "band-gap" transistor circuit. The respective middle points of R4, R5 and 28, 29 are connected to the inputs of a differential feedback amplifier 24a whose output is referenced 25.

The operation of the detector ordered by switches I1, I2 will now be described in greater detail with reference to FIGS. 3 and 4, in which the inactive parts of device 20 are shown with broken lines.

Figure 3:
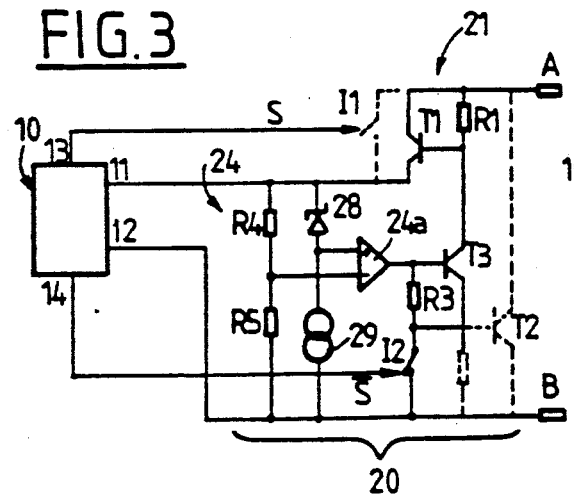
FIGS. 3 and 4 show the active parts of the detector of FIG. 2 when it is respectively in the off state and in the on state.

In FIG. 3, the detector is shown in the off state, this state resulting in the passage of too low a current for operating load 31, but sufficient to provide stand-by of its own circuitry.

The signal S delivered by sensor 10 causes switch I1 to open; the signal $\bar{S}$ causes switch I2 to close, which disables transistor T2. The signal delivered to the output 25 of amplifier 24a biases the base of T3 and the potential induced by conduction of the latter at the terminals of R1 causes the impedance of the series regulation circuit, which forms the ballast transistor T1, to vary. Thus, the minimum desired residual current is obtained, for the series impedance of transistor T1 is regulated so as to let pass only the minimum current required for operation of the sensor at the desired regulation voltage.

Figure 4:
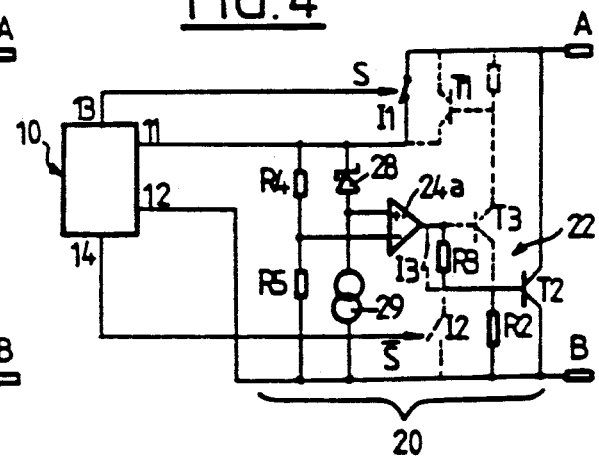

In FIG. 4, the detector is shown in the on state, i.e. it allows a current to pass via the power transistor T2 which is sufficient to operate load 31, while benefiting from the regulated voltage drop at the terminals of T2 for continuing to be supplied with power.

Signal S closes switch T1, whereas $\bar{S}$ opens switch I2. The closure of I1 disables transistor T1. The output signal of amplifier 24a is applied to the base of T2 via R3; the result is that T2, whose base-emitter path is biassed by R2, conducts and determines the operation of load 31. Thus, the regulated voltage is obtained which is required for operation of the sensor and equal to the waste voltage of the parallel regulation transistor T2.

When switch I3 is provided, it is closed by signal S which allows the output signal from the amplifier to be applied directly to the base of T2.

It will be noted that the voltage reference and feedback member 24 provides a stable and precise regulated voltage, this voltage remaining identical when the detector is in the off state or in the on state, which avoids disturbing sensor 10. The precision obtained prevents the waste voltage of T2 from being overvalued, which, otherwise, would be necessary to take into account in particular the tolerancing and temperature drifts of the components. In addition, the volume of the components used is reduced. It should in particular be noted that a single output transistor T2 has passing therethrough the current to be switched by device 20 in the on state and that the two switches I1, I2 only switch low currents: for I1 it is the current consumed by the detector for its operation and for I2 the current for controlling transistor T1 via transistor T3.

The sub-assembly formed by the voltage reference element 28, preferably of "band-gap" type, the divider bridge R4, R5 and the differential amplifier 24a may advantageously be formed on an integrated circuit. This sub-assembly, even the whole of device 20 if the integration technology permits it, may be formed as an integrated circuit also comprising sensor 10.

The detector according to the invention may be formed by any detector of the "two wire" type other than the proximity detector described, for example capacitive, ultrasonic, photoelectric or other detectors.

What is claimed is:

1. A two-wire detector device comprising:
   i) a user circuit comprising a load in series with a DC or AC voltage source, said user circuit having first and second DC voltage terminals;
   ii) controllable impedance switch means connected across said DC voltage terminals, said controllable impedance switch means having a closed state in which said load is in an ON state, and an open state in which said load is in an OFF state, said controllable impedance switch means having, in the closed state, an impedance variable as a function of a first control signal;
   iii) a sensor having first and second supply terminals and first and second supply leads respectively connecting said first and second supply terminals to said first and second DC voltage terminals, said sensor further having an output terminal and delivering on said output terminal an output signal having first and second states;
   iv) feedback regulator means for comparing the voltage across said supply terminals of the sensor to a reference voltage and generating on an output a regulation signal as a function of the difference between said voltages;
   v) first control means for generating said first control signal from said regulation signal;
   vi) a ballast component connected in series in said first supply lead, said ballast component having an impedance variable as a function of a second control signal and second control means for generating said second control signal from said regulation signal;
   vii) switch means, controlled form said output signal of the sensor, for short-circuiting said ballast component and for closing said controllable impedance switch means when said output signal is in the first state and for enabling said ballast component and opening said controllable impedance switch means when said output signal is in the second state.

2. A two-wire detector device as claimed in claim 1, wherein said controllable impedance switch means comprises a first transistor having a collector-emitter path bridging said first and second supply leads, said first transistor further having a base, said switch means comprises a first switch connecting said base to said second supply lead and said first control means comprises a first resistor connecting said output of the feedback regulator means to the base of said first transistor and a second resistor connecting the base of said first transistor to said second supply lead.

3. A two-wire detector device as claimed in claim 1, wherein said ballast component comprises a second transistor having a collector-emitter path serially connected in said first supply lead and a base connected to said first supply lead via a third resistor, said switch means comprises a second switch connected across the collector-emitter path of said second transistor and said second control means comprises a third transistor having a base connected to said output of the feedback regulator means and a collector-emitter path connecting said third resistor to said output of the feedback regulator means through said first resistor.

4. A two-wire detector device as claimed in claims 2, wherein said switch means further comprises a third switch connected across said first resistor and controllable by said output signal of the sensor.

5. A two-wire detector device as claimed in claim 1, wherein said feedback regulator means comprise a voltage divider bridge connected across said first and second supply terminals of the sensor, said divider bridge having a tapping point, a constant current source and a Zener diode serially connected across said first and second supply terminals and a differential amplifier connected across said tapping point and the junction point between said Zener diode and said constant current source.

* * * * *